(12) United States Patent
Shibuya et al.

(10) Patent No.: US 6,518,494 B1
(45) Date of Patent: Feb. 11, 2003

(54) SILICON STRUCTURE, METHOD FOR PRODUCING THE SAME, AND SOLAR BATTERY USING THE SILICON STRUCTURE

(75) Inventors: Munehiro Shibuya, Kyoto (JP); Masatoshi Kitagawa, Osaka (JP); Yuuji Mukai, Osaka (JP); Akihisa Yoshida, Kyoto (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 1101 days.

(21) Appl. No.: 08/701,292

(22) Filed: Aug. 22, 1996

(30) Foreign Application Priority Data

Aug. 22, 1995 (JP) .............................................. 7-213304

(51) Int. Cl.$^7$ ......................... H01L 31/00; H01L 29/30; H01L 31/06
(52) U.S. Cl. ...................... 136/261; 136/255; 136/256; 136/258; 148/33.2; 257/465
(58) Field of Search ................................. 136/255–256, 136/258 PC, 258 AM, 261; 257/465; 148/33.2

(56) References Cited

U.S. PATENT DOCUMENTS

| | | | | |
|---|---|---|---|---|
| 4,099,986 A | * | 7/1978 | Diepers ....................... | 136/258 |
| 4,433,202 A | * | 2/1984 | Maruyama et al. .......... | 136/255 |
| 5,336,335 A | * | 8/1994 | Hall et al. ................... | 136/258 |

FOREIGN PATENT DOCUMENTS

| | | | | |
|---|---|---|---|---|
| JP | 3-151672 | * | 6/1991 | .................. 136/255 |

OTHER PUBLICATIONS

Frieser, "Low–Temperature Silicon Epitaxy", *Kinetics of Hydrolysis of CaF2*, vol. 115, No. 4, Apr. 1968, pp. 401–405.

Shibutani, et al., "Efficiency Improvement of a Crystal Silicon Solar Battery", The Third 'High Efficiency Solar Battery' Workshop in Toyama (1992), Japanese preliminary report A–6, pp. 32–35.

Takayama, et al., "High Efficiency Solar Battery Using a Large Area Cast Substrate", The Third 'High Efficiency Solar Battery' Workshop in Toyama (1992), Japanese preliminary report A–6, pp. 28–31.

* cited by examiner

*Primary Examiner*—S. H. Ver Steeg
(74) *Attorney, Agent, or Firm*—Merchant & Gould, P.C.

(57) ABSTRACT

A silicon structure having little solar light beam reflection, which is suitable for a solar battery. On the entire surface of a quartz substrate, Mo is deposited at a thickness of approximately 51 μm to form a lower electrode. On the entire surface of the lower electrode, a p type silicon structure having a thickness of 30 to 40 μm comprising an aggregate of a plurality of columnar silicon members mainly comprising silicon and having random orientations is formed via a film mainly comprising silicon, using $Si_2Cl_6$ mixed with $BCl_3$. On the surface of the p type silicon structure, P is diffused by a thermal diffusion method using $POCl_3$ to form an n type region at the periphery of the columnar silicon members. On the entire surface of the p type silicon structure, a transparent electrode comprising indium-tin oxide having a thickness of 30 to 40 μm is formed, and an upper electrode comprising Al having a thickness of approximately 1 μm is formed on the transparent electrode.

10 Claims, 7 Drawing Sheets

SILICON STRUCTURE, METHOD FOR PRODUCING THE SAME, AND SOLAR BATTERY USING THE SILICON STRUCTURE

BACKGROUND OF THE INVENTION

1. Field of the Invention

The present invention relates to a silicon structure which can be applied to a light-emitting device or a solar battery, the method and apparatus for producing the same, and a solar battery using the silicon structure.

2. Disclosure of the Prior Art

In order to reduce the reflection of sunlight at its surface, a solar battery using silicon has been provided with an antireflection coating or an uneven surface.

The structure of a conventional solar battery will be explained with reference to FIG. 7, which is a cross-sectional diagram of a conventional silicon solar battery having a textured surface structure. As FIG. 7 illustrates, an uneven surface is formed at the light incident side of a p type silicon substrate 31 so as to reduce the reflection of the sunlight. Commonly used methods of forming the unevenness include a chemical formation method using photolithography and chemical etching, and a mechanical formation method using a dicing machine. Examples of silicon substrates include single crystal substrates produced by the Czochralski method and polycrystalline substrates produced by casting. An n type silicon layer 32 is formed on the uneven surface of the p type silicon substrate 31. The n type silicon layer 32 is formed by diffusing P (phosphorus) using a gas such as $POCl_3$ on the uneven surface of the p type silicon substrate 31 so as to convert part of the p type silicon substrate 31 to n type. An antireflection coating 33 comprising materials such as SiN and $MgF_2$ is formed on the n type silicon layer 32. Further, a front surface electrode 34 is formed on the light receiving side of the p type silicon substrate 31 via an n++ silicon layer 35, and the front surface electrode 34 is exposed on the surface of the antireflection coating 33. A back side electrode 36 is formed on the back side of the p type silicon substrate 31 via a p+ silicon layer 37. By forming a p+ silicon layer 37 between the back side electrode 36 and the p type silicon substrate 31, the energy conversion efficiency can be improved (see the Third "High Efficiency Solar Battery" workshop preliminary reports, hosted by the Institute of Electrical Engineers, Semiconductor Electric Power Conversion Technology Committee, in Toyama, Japan, Oct. 5, 1992, Vol. A5–A6, pages 28–35).

Although the above mentioned conventional silicon solar battery configuration enables efficient collection of sunlight, the method of manufacture includes complicated processes to form the unevenness. This increases the production cost and thus the method is not suitable for practical use.

SUMMARY OF THE INVENTION

In order to solve the above mentioned problems in the conventional technology, an object of the present invention is to provide a silicon structure exhibiting little sunlight reflection, the method and apparatus for producing the same, and a solar battery using the silicon structure.

In order to achieve the above mentioned object, a configuration of the silicon structure of the present invention comprises an aggregate of a plurality of columnar silicon members mainly comprising silicon and having random orientations. According to the configuration of the silicon structure, since the light beam incident on one columnar silicon member is reflected thereby and re-enters another columnar silicon member, the sunlight can be absorbed efficiently. That is, according to the configuration of the silicon structure of the present invention, a silicon structure having little sunlight reflection can be obtained. It is preferable that the silicon content of the columnar silicon members is 95 weight % or more, and in addition to the silicon, about 1 weight % of chlorine and a few weight % of oxygen can be included.

In the above mentioned configuration of the silicon structure of the present invention, it is preferable that a substrate is provided and the silicon structure is formed on the substrate via a film mainly comprising silicon. According to the preferable embodiment, a transparent electrode does not come in contact with a lower electrode in the process of producing a solar battery using the silicon structure.

In the above mentioned configuration of the silicon structure of the present invention, it is more preferable that the diameter of the columnar silicon member is 0.1 to 10 µm. According to this embodiment, an adequate strength of the columnar silicon can be maintained and the depth of the junction formed when converting to an n type or a p type does not need to be limited. Further, the light absorption does not deteriorate.

According to the configuration of the silicon structure of the present invention, it is further preferable that the periphery of the columnar silicon member is amorphous and the center thereof is polycrystalline.

Further, the silicon structure comprising an aggregate of a plurality of columnar silicon members mainly comprising silicon having random orientations can be produced by a method wherein an atomized or vaporized silicon material containing chlorine is introduced to a heated substrate with oxygen gas. According to this production method, since a silicon containing raw material less dangerous than silane gas ($SiH_4$) can be used, the silicon containing raw material can be supplied in a great amount. As a consequence, since the silicon formation rate can be improved, a silicon structure comprising an aggregate of a plurality of columnar silicon members mainly comprising silicon can be obtained. In this case, an inert gas can be introduced to the substrate at the same time in order to convey a silicon containing raw material also containing chlorine. Besides, by conveying a silicon containing raw material with an inert gas including hydrogen, or with only hydrogen, the amount of chlorine in the silicon structure can be reduced. Further, since a complicated process to form an uneven shape is not necessary unlike with the conventional textured structure, the production cost can be reduced.

According to the production method of the silicon structure of the present invention, it is preferable that the silicon containing raw material also containing chlorine is $Si_2Cl_6$. According to the preferable embodiment, since the decomposition temperature is approximately 350° C., which is low, and the decomposition can be conducted by radiating an ultraviolet beam (188 nm), a silicon structure comprising an aggregate of a plurality of columnar silicon members mainly comprising silicon and having random orientations can be obtained easily. In this case, it is more preferable that an n type or p type silicon structure is formed using a liquid material containing $PCl_3$ or $BCl_3$ as the silicon containing raw material comprising $Si_2Cl_6$.

In the above mentioned production method, it is more preferable that the oxygen gas is introduced so that the oxygen content in the vicinity of the centers of the columnar silicon members becomes 3% or less. According to this embodiment, the resistance of the silicon structure can be kept at a low level and thus the silicon structure can be used in an electronic device.

Further, an apparatus for producing the silicon structure of the present invention comprises a chamber, means to supply an atomized or vaporized liquid material comprising silicon and oxygen gas to the chamber, a support for the substrate to be treated by the apparatus, a heater for the substrate, and a filter having an area that is at least as large as the area of the substrate, through which the atomized or vaporized liquid material and oxygen gas are introduced to the substrate. According to the configuration of this apparatus, since the atomized or vaporized liquid material is uniformly diffused in the area of approximately the size of the filter at the time of passing through the filter and introduced to the surface of the substrate, a silicon layer can be formed uniformly on the substrate.

In the above mentioned production apparatus of the silicon structure of the present invention, it is preferable that the filter comprises a stainless steel fiber. According to this embodiment, a filter having a large area and a very large void ratio of from 70 to 90% and a uniform pore size can be formed at a low cost. And by dividing the vaporizing chamber and the process chamber with the filter, a pressure difference between the vaporizing chamber and the process chamber is unlikely to be generated and thus condensation of the material caused by adiabatic expansion can be prevented.

In the above mentioned production apparatus of the silicon structure of the present invention, it is more preferable that the pore size of the filter is 1 to 30 µm. According to this embodiment, a raw material gas and oxygen gas can be sprayed on the substrate uniformly.

Further, a solar battery of the present invention comprises a semiconductor layer for generating electron-hole pairs by light absorption, wherein the semiconductor layer includes a silicon structure comprising an aggregate of a plurality of columnar silicon members mainly comprising silicon and having random orientations. According to the configuration of the solar battery, since the sunlight reflection is reduced, power generation can be efficiently conducted.

In the above mentioned configuration of the solar battery of the present invention, it is preferable that a substrate is provided and the silicon structure is formed on the substrate via a film mainly comprising silicon.

In the above mentioned configuration of the solar battery of the present invention, it is more preferable that the diameter of the columnar silicon member is 0.1 to 10 µm.

In the above mentioned configuration of the solar battery of the present invention, it is further preferable that the periphery of the columnar silicon member is amorphous and the center portion is polycrystalline.

In the above mentioned configuration of the solar battery of the present invention, it is more preferable that the silicon structure is formed on the surface of the semiconductor layer at the side on which the light is incident.

In the above mentioned configuration of the solar battery of the present invention, it is further preferable that a pn junction is formed inside the columnar silicon. According to this embodiment, the following advantage can be achieved. That is, since the area of the pn junction portion can be increased in the case of a silicon structure comprising a plurality of columnar silicon members compared with the case of a conventional flat film, power generation can be conducted efficiently.

DETAILED DESCRIPTION OF THE PREFERRED EMBODIMENTS

Hereinafter the present invention will be further explained with reference to preferred embodiments.

First Embodiment

Figure 1:
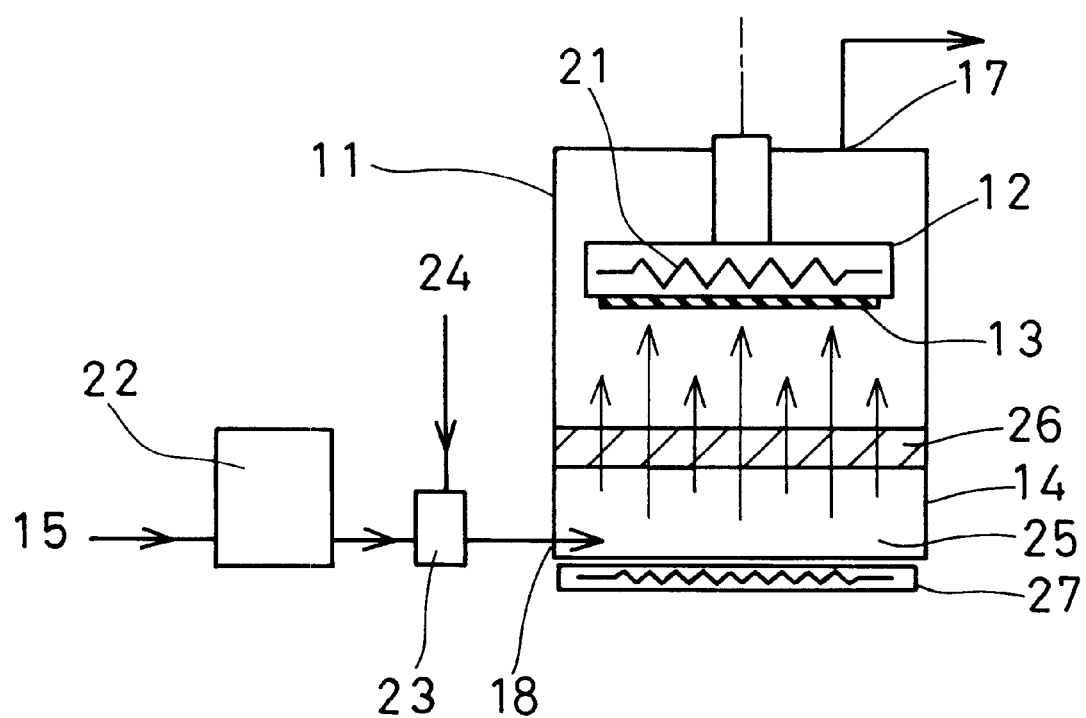
FIG. 1 is a diagram illustrating the silicon film formation device used in the first embodiment of the present invention.

FIG. 1 is a diagram illustrating the silicon film formation device used in the first embodiment of the present invention. As shown in FIG. 1, the inside of a process chamber 11 having an air-tight structure is divided by a horizontal filter 26. The filter 26 is formed by sintering many stainless steel fibers having a few µm diameter and a pore size of about 10 µm. The process chamber 11 has a raw material gas supply orifice 18 in the side wall beneath the filter 26 (the vaporizing chamber 14) for supplying an atomized or vaporized liquid material 15 to the process chamber 11 from a vaporizer 23, with the flow rate being adjusted by a flow control device 22 as needed. The vaporizer 23 can be supplied with oxygen gas 24 so as to supply a liquid material 15 containing the oxygen gas 24 to the process chamber 11. An exhaust orifice 17 is formed in the upper wall above the filter 26 in the process chamber 11. A substrate holder 12 in which a heater for heating the substrate 21 is embedded is located horizontally above the filter 26 in the process chamber 11 so as to hold a substrate 13 on the lower side thereof. Further, a vaporization aiding heater 27 is arranged under the filming chamber 11.

A method for producing the silicon structure of the present invention using the above mentioned silicon film formation device will be explained hereinafter.

In this embodiment, a quartz substrate was used for the substrate 13. The substrate 13 was heated by the heater 21 to approximately 680° C. ($Si_2Cl_6+BCl_3$) was used as the liquid material 15. The inside of the process chamber 11 was kept at atmospheric pressure.

The liquid material 15 was propelled by an inert gas such as Ar and the flow rate was controlled at a proper level by flow control device 22. Then the liquid material 15 was atomized or vaporized and mixed with the inert gas and oxygen gas 24 in a vaporizer 23, and was supplied to the vaporizing chamber 14 from the raw material gas supply orifice 18. At the same time, a reducing gas 25 such as $H_2$ was supplied to the vaporizing chamber 14. It is preferable that the flow rate of the oxygen gas 24 is 1 to 10 cc/minute with respect to the flow rate of $Si_2Cl_6$ of 10 g/hour ($H_2O$ calibration). After being heated by the vaporization aiding heater 27, all the gases supplied to the vaporizing chamber 14 were uniformly diffused by passing through the filter 26 and sprayed onto the substrate 13. Then $Si_2Cl_6$ in the atomized or vaporized state was thermally decomposed to form a p type silicon structure on the substrate 13. Methods for atomizing the liquid material 15 include using ultrasonic vibrations.

According to the above described production method, since a silicon containing raw material such as $Si_2Cl_6$, which is less dangerous than silane gas ($SiH_4$), can be used, the containing raw silicon material can be supplied to the process chamber 11 in a great amount. As a consequence, since the silicon formation rate can be improved, a silicon structure comprising an aggregate of a plurality of columnar silicon members mainly comprising silicon and having random orientations can be obtained. In this case, it is preferable that the oxygen content in the vicinity of the centers of the columnar silicon is 3% or less. By setting the flow rate of the oxygen gas 24 as mentioned above, the oxygen content in the vicinity of the center of a columnar silicon member can be made 3% or less. The 3% or less oxygen content in the vicinity of the center of the columnar silicon member enables maintaining the resistance of the silicon structure at a low level so that the silicon structure can be used in an electronic device. The "vicinity of the center of the columnar silicon member" herein denotes the region, excluding the surface region, to about 50 nm depth of the columnar silicon member.

Although $Si_2Cl_6$ was used as the silicon containing raw material also containing chlorine in this embodiment, it is not limited thereto but other materials can be used as well. Examples of the silicon materials containing chlorine include $SiCl_4$, $SiH_2Cl_2$, $SiHCl_3$, $Si_3Cl_8$ and $Si_4Cl_{10}$. When a silicon containing raw material having a comparatively high vapor pressure such as $SiH_2Cl_2$ and $SiHCl_3$ is used, the raw material must be liquefied by pressing or cooling. By using $Si_2Cl_6$ as the silicon containing raw material also containing chlorine as in this embodiment, since $Si_2Cl_6$ has a decomposition temperature of approximately 350° C., which is low, and is decomposed by ultraviolet radiation of 188 nm, a silicon structure can be easily formed.

Although Ar was used as the inert gas for spraying in this embodiment, it is not limited thereto but other gases such as He and $N_2$ can be used as well. As a method for introducing the inert gas into the process chamber 11, a so-called bubbling method, namely, a method of introducing the liquid material 15 to the process chamber 11 as bubbles, can be used.

Although $H_2$ gas was used as the reducing gas 25 in this embodiment, it is not limited thereto but other gases such as CO can be used as well. Further, a silicon structure can be formed without introducing a reducing gas. Besides, by conveying the silicon containing raw material with only $H_2$ gas without using an inert gas, the amount of chlorine contained in the silicon structure can be reduced.

Although quartz is used as the substrate 13 in this embodiment, it is not limited thereto but other materials such as a ceramic material or a metallic material such as stainless steel can be used as well.

Although the film formation was conducted in the chamber at an ordinary pressure (1 atmospheric pressure) in this embodiment, it is not limited thereto but the film formation can be conducted in a vacuum state (0.1 to 760 Torr) or in a pressurized state (1 to 10 atmospheric pressure). In particular, by conducting the film formation in the pressurized state, the deposition rate can be further increased.

Although a liquid mixture of $Si_2Cl_6$ and $BCl_3$ was used for p type silicon formation in this embodiment, by using only $Si_2Cl_6$, a nearly intrinsic silicon can be obtained. And by using $PCl_3$ in place of $BCl_3$, an n type silicon can be formed. In this case, by supplying $Si_2Cl_6$ and $BCl_3$ or $PCl_3$ separately without preparing a raw material liquid mixture, a silicon structure can be formed as well.

Although a filter 26 comprising stainless steel fibers was used in this embodiment, it is not limited thereto but a filter 26 made of other materials such as quartz can be used as well. In particular, by forming a filter 26 by sintering many stainless steel fibers, a filter having a large area and a very large void ratio of from 70 to 90% can be provided at a low cost. By dividing the vaporizing chamber 14 and the process chamber 11 with the filter, a pressure difference between the vaporizing chamber 14 and the process chamber 11 is unlikely to be generated. Further, although the pore size of the filter 26 was set to be 10 μm, the pore size is not limited thereto but any filter 26 having a pore size of 1 to 30 μm can allow uniform spraying of a raw material gas or oxygen gas onto the substrate 13.

Figure 2B:
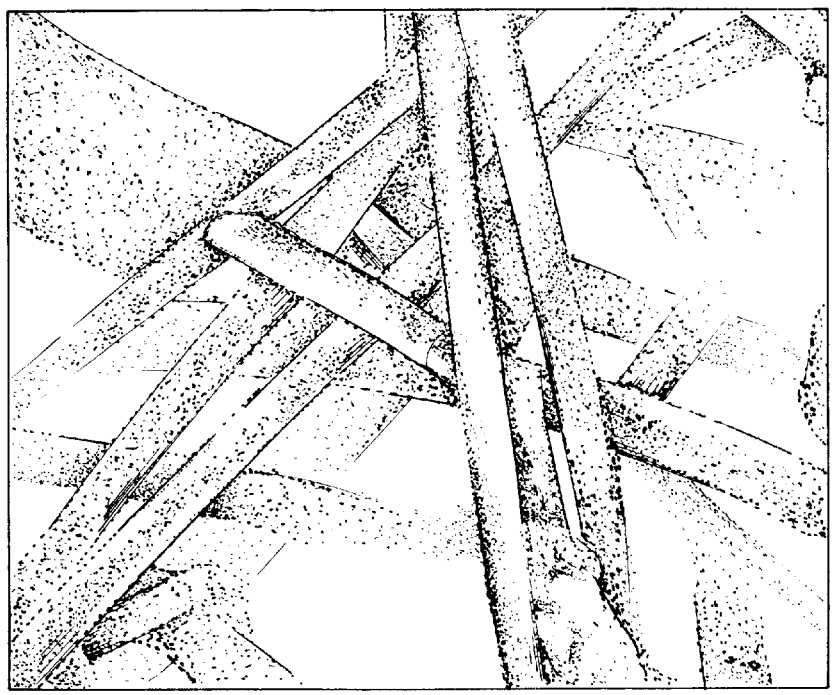
FIGS. 2A and 2B are tracings of a scanning electron microscope photograph (SEM) of the silicon structure formed in the first embodiment of the present invention.
Figure 2A:
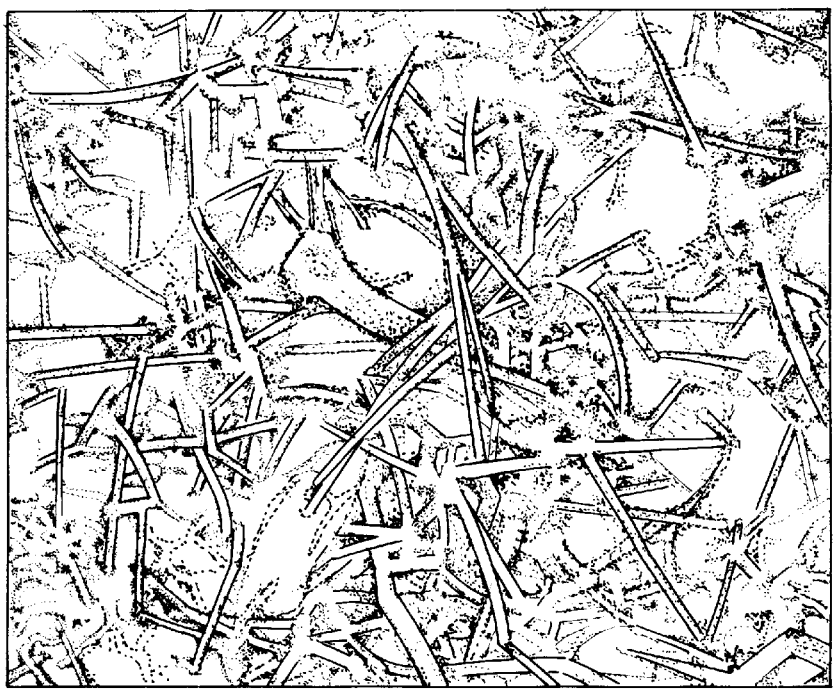

FIGS. 2A, 2B are tracings of scanning electron microscope photographs (SEM) of the silicon structure formed in this embodiment. FIG. 2A and FIG. 2B illustrate the same sample in different magnifications. As seen from FIGS. 2A and 2B, a silicon structure comprising an aggregate of a plurality of columnar silicon members having a diameter of approximately 0.5 μm, mainly comprising silicon and having different orientations, was formed. By using the silicon structure, since a light beam which enters into and is reflected by a columnar silicon member enters another columnar silicon member, the sunlight can be absorbed efficiently. That is, a silicon structure having little sunlight reflection can be obtained.

Figure 3C:
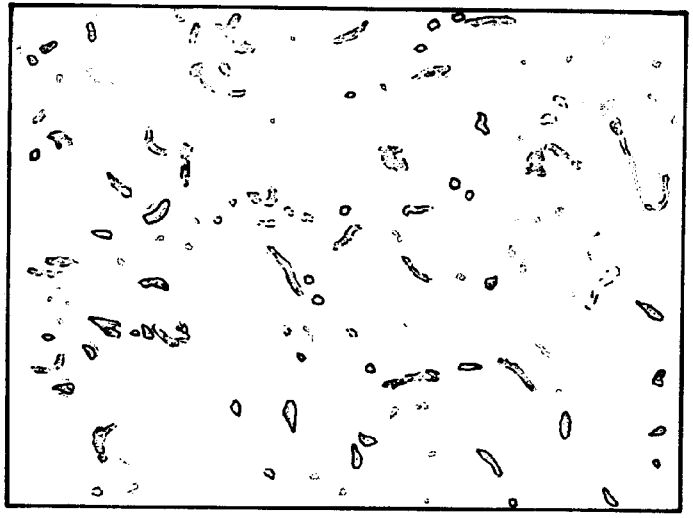
FIGS. 3A to 3C are tracings of a laser microscope photograph of the surface shapes of the silicon films formed with different oxygen amounts in the first embodiment of the present invention.
Figure 3B:
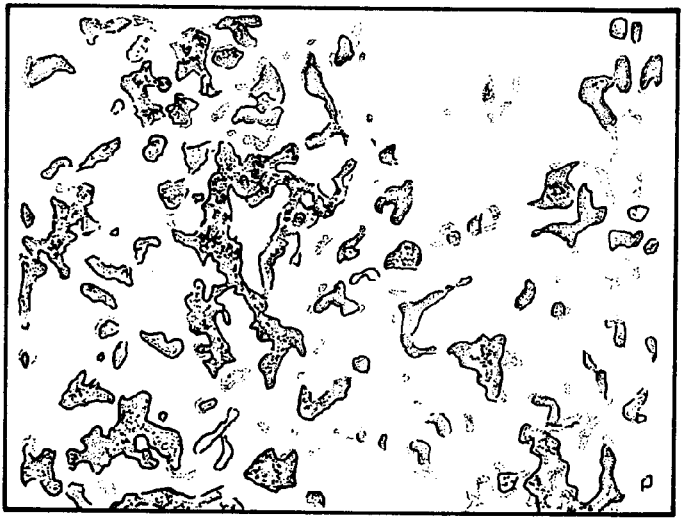
Figure 3A:

FIGS. 3A to 3C are tracings of laser microscope photographs illustrating the surface shape of silicon films formed with different oxygen amounts. FIGS. 3A to 3C are shown with the black and white portions reversed with respect to the actual laser microscope photographs in 1,000 magnification. Film formation conditions are as per Table 1.

TABLE 1

| | |
|---|---|
| $Si_2Cl_6$ flow rate | 10 g/hour ($H_2O$ calibration) |
| Ar (3% $H_2$) flow rate | 400 cc/minute |
| $O_2$ flow rate | 0, 1, 3 cc/minute |
| Substrate temperature | 675° C. |
| Pressure | Ordinary pressure |

As illustrated in FIG. 3A, when the oxygen flow rate was 0 cc/min, an approximately flat film (black portion) was formed. As illustrated in FIG. 3B, when the oxygen flow rate was 1 cc/min, although a silicon structure (white portion) was partially formed, a flat portion (black portion) still remains. As illustrated in FIG. 3C, when the oxygen flow rate was 3 cc/min, a silicon structure (white portion) was formed almost completely. From these results, it was learned that oxygen plays a key role in the silicon structure formation.

Figure 4:
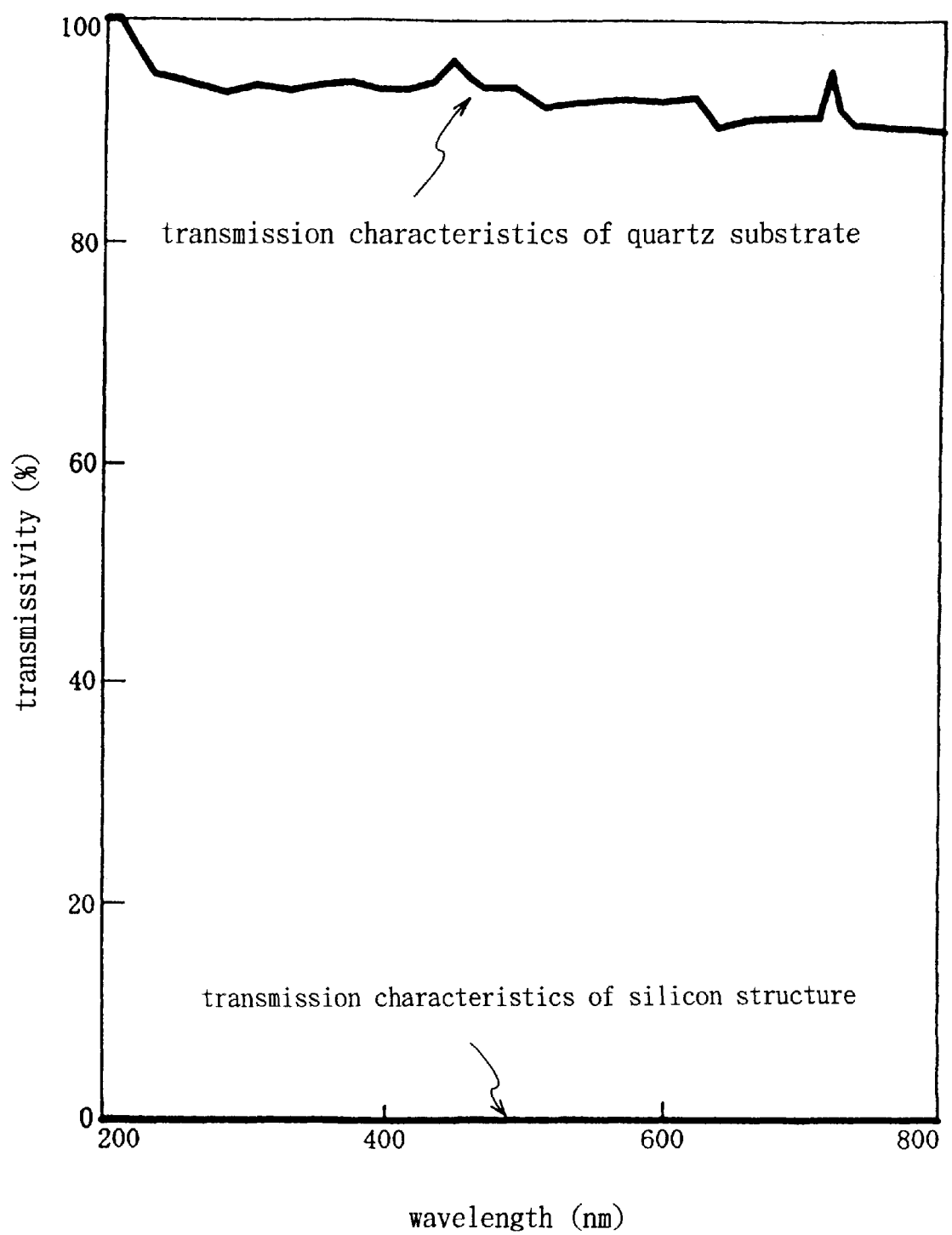
FIG. 4 is a graph illustrating the visible absorption spectrum of the silicon structure formed on the quartz substrate in the first embodiment of the present invention.

FIG. 4 illustrates the visible absorption spectrum of the silicon structure formed on a quartz substrate in this embodiment. As shown in FIG. 4, the silicon structure formed in this embodiment barely transmits light having wavelengths of 200 to 800 nm.

Although the silicon structure comprises columnar silicon members having a diameter of approximately 0.5 μm in this embodiment, the diameter of columnar silicons can vary as long as it is in the range of 0.1 to 10 μm. The diameter of the columns within the above mentioned range provides the columns with a proper strength and also does not limit the junction depth when changing the surface of the silicon to an n type or a p type by diffusion. Further, if the diameter of the columns is in the above mentioned range, light absorption is not deteriorated.

Second Embodiment

Figure 5A:
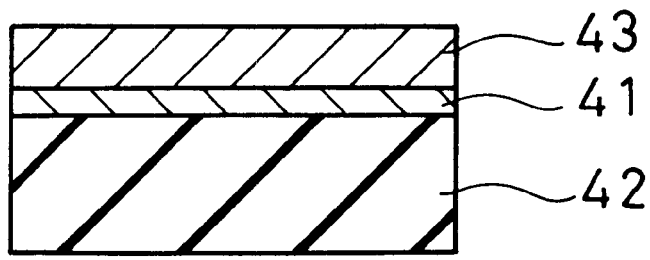
FIGS. 5A to 5C are diagrams illustrating the process for producing the solar battery using the silicon structure in the second embodiment of the present invention.
Figure 5B:
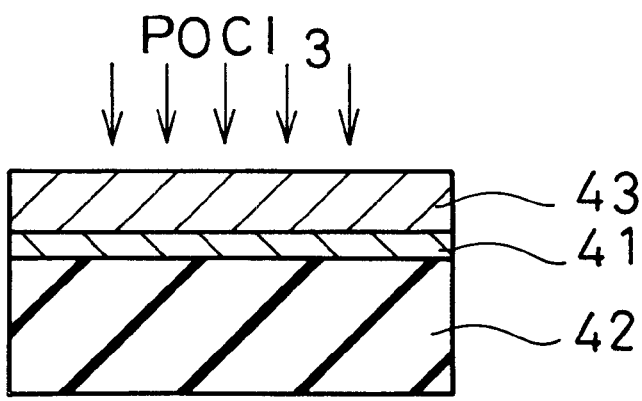
Figure 5C:
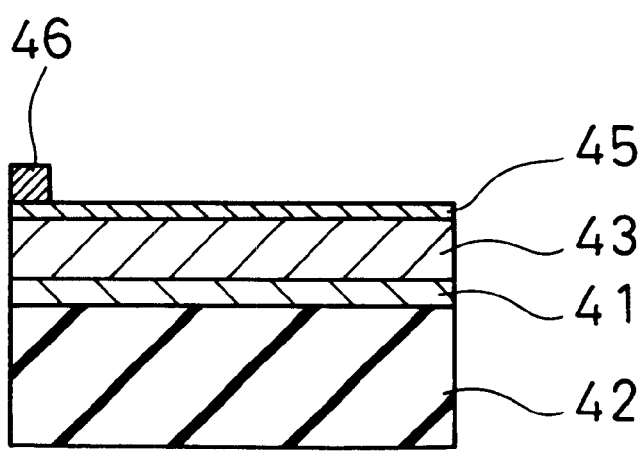
Figure 6:
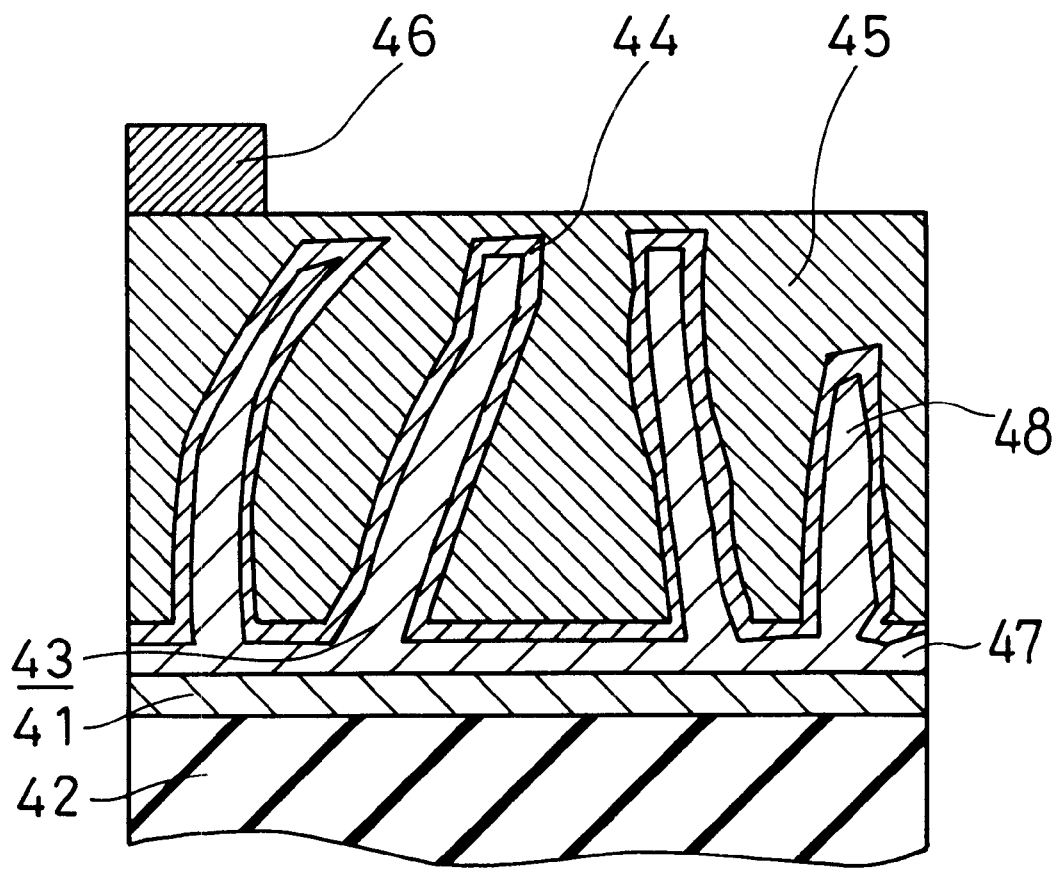
FIG. 6 is a cross-sectional view illustrating the configuration of the solar battery of the second embodiment of the present invention.
Figure 7:
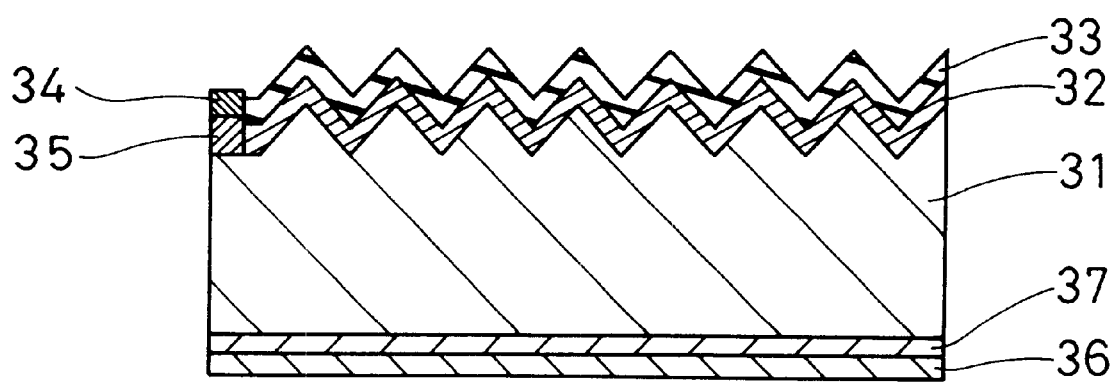
FIG. 7 is a cross-sectional diagram illustrating the configuration of the silicon solar battery (textured structure) of a conventional silicon solar battery.

FIGS. 5A to 5C are diagrams illustrating the production process of the solar battery using the silicon structure in the second embodiment. FIG. 6 illustrates the configuration of the solar battery of this embodiment.

As shown in FIG. 5A, on the entire surface of a quartz substrate 42 having a 0.5 mm thickness, Mo was deposited at approximately 1 μm thickness to form a lower electrode 41. Then a p type silicon structure 43 of 30 to 40 μm thickness was formed on the entire surface of the lower electrode 41 using $Si_2Cl_6$ including $BCl_3$. In this case, as shown in FIG. 6, a p type silicon structure 43 comprising an aggregate of a plurality of columnar silicon members 48 mainly comprising silicon and having random orientations was formed on the lower electrode 41 via a film 47 mainly comprising silicon (hereinbefore related to FIG. 5A). By forming a p type silicon structure 43 comprising an aggregate of a plurality of columnar silicon members 48 on the lower electrode 41 via a film 47 mainly comprising silicon 47, there is no risk of transparent electrode 45 contacting the lower electrode 41 when forming the transparent electrode 45 as explained below.

As shown in FIG. 5B, on the surface of the p type silicon structure 43, P was diffused by a thermal diffusion method using $POCl_3$ to form an n type region 44 at the periphery of the silicon columns 48 (see FIG. 6). By this operation, a pn junction is formed inside the silicon columns 48. Since the present silicon structure 43 comprising a plurality of columnar silicon members 48 has a pn junction in an area larger than that of a conventional flat film, power generation can be conducted efficiently. In this case, although the center portions of the columnar silicon members 48 remains polycrystalline, the peripheral portions of the columnar silicon members 48 become amorphous. Since amorphous silicon has a resistance higher than that of polycrystalline silicons, it is preferable to have a polycrystalline region in a large area. Specifically speaking, with respect to a diameter of 0.5 μm of the silicon columns 48, a preferable thickness of the n type region (amorphous) 44 is approximately 0.1 μm.

As shown in FIG. 5C, after forming a transparent electrode 45 comprising indium-tin oxide having a thickness of approximately 30 to 40 μm on the entire surface of the p type silicon structure 43, an upper electrode 46 comprising Al was formed at approximately 1 μm thickness on the transparent electrode 45. In this case, the transparent electrode is formed so as to fill in the gaps between a plurality of columnar silicon members 48 of the p type silicon structure 43. By the above mentioned operation, a solar battery can be obtained.

Since a solar battery produced by the above mentioned procedure contains a silicon structure comprising an aggregate of a plurality of columnar silicon members 48 mainly comprising silicon and having random orientations in the semiconductor layer, the solar battery does not reflect sunlight and thus power generation can be conducted efficiently.

In the below mentioned Table 2, properties of the solar battery of this embodiment are shown in comparison with a solar battery of conventional technology.

TABLE 2

|  | Open circuit voltage (mV) | Short circuit light current (mA/cm$^2$) |
|---|---|---|
| Solar battery of the second embodiment of the present invention | 602 | 39.1 |
| Solar battery of a conventional method | 600 or less | 37 or less |

Note:
The light receiving area was 25 cm$^2$.

As shown in Table 2, although the open circuit voltages were almost the same, the short circuit current was greater in the second embodiment than in the conventional battery.

As heretofore mentioned, according to the present invention, the formation of surface texture which requires complicated processes is unnecessary, whereas a silicon structure which can provide effects equivalent to the surface texture can be realized by the method of the invention. Accordingly, by using the inventive silicon structure in a solar battery, a solar battery having little sunlight reflection and a high energy conversion efficiency can be provided at a low cost.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. Silicon having a structure comprising an aggregate of a plurality of columnar silicon members mainly comprising silicon and having random orientations, the columnar silicon members being at least partially spaced from each other whereby light reflected from one of the columnar silicon members can enter another of the columnar silicon members.

2. The silicon structure according to claim 1, wherein the peripheral portions of the columnar silicon members are amorphous and the center portions of the columnar silicon members are polycrystalline.

3. The silicon structure according to claim 1, wherein the diameter of the columnar silicon members is from 0.1 to 10 μm.

4. A substrate having a first surface on which the silicon structure of claim 1 is formed via a film mainly comprising silicon.

5. A solar battery comprising a semiconductor layer for generating electron-hole pairs by light absorption, wherein the semiconductor layer comprises silicon having a structure comprising an aggregate of a plurality of columnar silicon members mainly comprising silicon and having random orientations, the columnar silicon members being at least partially spaced from each other whereby light reflected from one of the columnar silicon members can enter another of the columnar silicon members.

6. The solar battery according to claim 5, further comprising a substrate, on which the silicon structure is formed via a film mainly comprising silicon.

7. The solar battery according to claim 5, wherein the diameter of the columnar silicon members is 0.1 to 10 μm.

8. The solar battery according to claim 5, wherein the peripheral portions of the columnar silicon members are amorphous and the center portions of the columnar silicon members are polycrystalline.

9. The solar battery according to claim 5, wherein the silicon structure is formed on the surface of the side of the semiconductor layer at which light is incident.

10. The solar battery according to claim 5, wherein a pn junction is formed inside each of the columnar silicon members.

* * * * *

UNITED STATES PATENT AND TRADEMARK OFFICE
CERTIFICATE OF CORRECTION

PATENT NO. : 6,518,494 B1 Page 1 of 1
DATED : February 11, 2003
INVENTOR(S) : Shibuya et al.

It is certified that error appears in the above-identified patent and that said Letters Patent is hereby corrected as shown below:

<u>Title page,</u>
Item [57], ABSTRACT,
Line 4, "51 $\mu$m" should read -- 1 $\mu$m --

Signed and Sealed this

Twenty-seventh Day of January, 2004

JON W. DUDAS
*Acting Director of the United States Patent and Trademark Office*